(12) United States Patent
Yoshimi et al.

(10) Patent No.: US 11,855,677 B2
(45) Date of Patent: Dec. 26, 2023

(54) HIGH-FREQUENCY SIGNAL TRANSMISSION-RECEPTION CIRCUIT

(71) Applicant: Murata Manufacturing Co., Ltd., Kyoto (JP)

(72) Inventors: Syunji Yoshimi, Kyoto (JP); Mizuho Ishikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/937,594

(22) Filed: Oct. 3, 2022

(65) Prior Publication Data

US 2023/0027206 A1    Jan. 26, 2023

Related U.S. Application Data

(63) Continuation of application No. 16/837,458, filed on Apr. 1, 2020, now Pat. No. 11,601,153.

(30) Foreign Application Priority Data

Apr. 2, 2019    (JP) .................................. 2019-070599

(51) Int. Cl.
*H04B 1/40*        (2015.01)
*H01P 5/08*        (2006.01)
(Continued)

(52) U.S. Cl.
CPC ................. *H04B 1/40* (2013.01); *H01P 5/08* (2013.01); *H03F 3/19* (2013.01); *H03H 7/0115* (2013.01);
(Continued)

(58) Field of Classification Search
CPC .... H04B 1/0064; H04B 1/0057; H04B 1/006; H04B 7/0604; H04B 7/0602; H04B 1/52
See application file for complete search history.

(56) References Cited

U.S. PATENT DOCUMENTS 9,385,795 B1    7/2016  Ananthanarayanan et al.
10,116,339 B2   10/2018 Anthony et al.
(Continued)

FOREIGN PATENT DOCUMENTS

| JP | 2007-158973 A | 6/2007 |
|---|---|---|
| JP | 5876582 B2 | 3/2016 |
| JP | 2018-026795 A | 2/2018 |

*Primary Examiner* — Aristocratis Fotakis
(74) *Attorney, Agent, or Firm* — Pearne & Gordon LLP

(57) ABSTRACT

A high-frequency signal transmission-reception circuit includes a plurality of band pass filter groups each including a plurality of band pass filter pairs; a first switch including a plurality of band pass filter-side terminal groups each including a plurality of band pass filter-side terminals, and an antenna-side terminal group; a plurality of couplers configured to output respective signal strengths of high-frequency signals transmitted on a plurality of transmission paths; and a second switch including an input terminal group electrically connected to the plurality of couplers, and an output terminal configured to output a detection signal output from one of the plurality of couplers. The first switch electrically connects one band pass filter-side terminal in one band pass filter-side terminal group and one antenna-side terminal, and also electrically connects one band pass filter-side terminal in another band pass filter-side terminal group and another antenna-side terminal.

11 Claims, 6 Drawing Sheets

(51) Int. Cl.
  *H03F 3/19* (2006.01)
  *H03H 7/01* (2006.01)
(52) U.S. Cl.
  CPC .. *H03F 2200/294* (2013.01); *H03F 2200/451* (2013.01)

(56) References Cited

U.S. PATENT DOCUMENTS

| | | | |
|---|---|---|---|
| 2012/0129469 A1 | 5/2012 | Lorenz et al. | |
| 2013/0040671 A1 | 2/2013 | Zawaideh et al. | |
| 2014/0334362 A1 | 11/2014 | Granger-Jones | |
| 2015/0043669 A1 | 2/2015 | Ella et al. | |
| 2015/0295594 A1 | 10/2015 | Kehrer | |
| 2016/0050665 A1 | 2/2016 | Chang et al. | |
| 2016/0119003 A1* | 4/2016 | Granger-Jones | H04L 5/001 370/276 |
| 2016/0119015 A1 | 4/2016 | Ku | |
| 2016/0191085 A1 | 6/2016 | Kasnavi et al. | |
| 2016/0242113 A1 | 8/2016 | McIntyre | |
| 2016/0254870 A1* | 9/2016 | O'Keeffe | H04B 17/14 455/67.14 |
| 2016/0381649 A1* | 12/2016 | Anthony | H03F 3/19 455/127.2 |
| 2017/0026136 A1 | 1/2017 | Thompson et al. | |
| 2017/0257135 A1* | 9/2017 | Solomko | H04B 1/401 |
| 2017/0310355 A1 | 10/2017 | Hayakawa | |
| 2017/0373368 A1 | 12/2017 | Srirattana et al. | |
| 2018/0019768 A1 | 1/2018 | King et al. | |
| 2018/0337643 A1 | 11/2018 | Yoshimi | |
| 2019/0007073 A1* | 1/2019 | King | H04B 1/0057 |
| 2019/0007086 A1 | 1/2019 | Mofidi et al. | |
| 2019/0052241 A1 | 2/2019 | Muto | |
| 2019/0052291 A1* | 2/2019 | King | H04B 1/56 |
| 2019/0123770 A1* | 4/2019 | Pehlke | H04B 7/08 |
| 2019/0158137 A1 | 5/2019 | Brunel et al. | |
| 2019/0181907 A1 | 6/2019 | Pfann et al. | |
| 2019/0190563 A1 | 6/2019 | Sakurai et al. | |
| 2019/0288728 A1* | 9/2019 | Bai | H04B 1/44 |
| 2020/0028597 A1 | 1/2020 | Al-Qaq et al. | |
| 2020/0220635 A1 | 7/2020 | Tahara et al. | |

* cited by examiner

HIGH-FREQUENCY SIGNAL TRANSMISSION-RECEPTION CIRCUIT

This is a continuation of U.S. patent application Ser. No. 16/837,458 filed on Apr. 1, 2020, which claims priority from Japanese Patent Application No. 2019-070599 filed on Apr. 2, 2019. The content of these applications is hereby incorporated herein by reference in its entirety.

BACKGROUND

The present disclosure relates to a high-frequency signal transmission-reception circuit. In mobile communication devices, such as mobile phone devices, a front-end module is used that outputs a high-frequency transmission signal to an antenna and receives a high-frequency reception signal from the antenna.

U.S. Pat. No. 10,116,339 described below discloses a front-end module that supports carrier aggregation (CA).

The front-end module disclosed in U.S. Pat. No. 10,116,339 is able to be used in the case of one antenna and is not able to be used in the case of a plurality of antennas.

BRIEF SUMMARY

In view of the above, the present disclosure has been made to enable use in the case of a plurality of antennas.

A high-frequency signal transmission-reception circuit according to one aspect of the present disclosure includes a plurality of band pass filter groups each including a plurality of band pass filter pairs each including at least one band pass filter; a first switch including a plurality of band pass filter-side terminal groups each including a plurality of band pass filter-side terminals electrically connected to respective one ends of the plurality of band pass filter pairs, and an antenna-side terminal group electrically connected to a plurality of antennas through a plurality of transmission paths; a plurality of couplers provided in the respective plurality of transmission paths and configured to output respective detection signals representing signal strengths of high-frequency signals transmitted on the plurality of transmission paths; and a second switch including an input terminal group electrically connected to the plurality of couplers, and an output terminal configured to output a detection signal output from one of the plurality of couplers. The first switch electrically connects one band pass filter-side terminal in one band pass filter-side terminal group of the plurality of band pass filter-side terminal groups and one antenna-side terminal in the antenna-side terminal group, and also electrically connects one band pass filter-side terminal in another band pass filter-side terminal group of the plurality of band pass filter-side terminal groups and another antenna-side terminal in the antenna-side terminal group. The second switch electrically connects one terminal in the input terminal group and the output terminal.

The present disclosure enables use in the case of a plurality of antennas.

Other features, elements, characteristics and advantages of the present disclosure will become more apparent from the following detailed description of embodiments of the present disclosure with reference to the attached drawings.

DETAILED DESCRIPTION

Embodiments of a high-frequency signal transmission-reception circuit according to the present disclosure will be described in detail below with reference to the drawings. Note that the present disclosure is not to be limited by these embodiments. Each embodiment is illustrative, and it goes without necessarily saying that configurations described in different embodiments can be partially replaced or combined. In second and subsequent embodiments, a description of things in common with a first embodiment is omitted, and only respects in which the second and subsequent embodiments differ from the first embodiment will be described. In particular, similar function effects achieved by similar configurations are not repeatedly described in each embodiment.

First Embodiment

Figure 1:
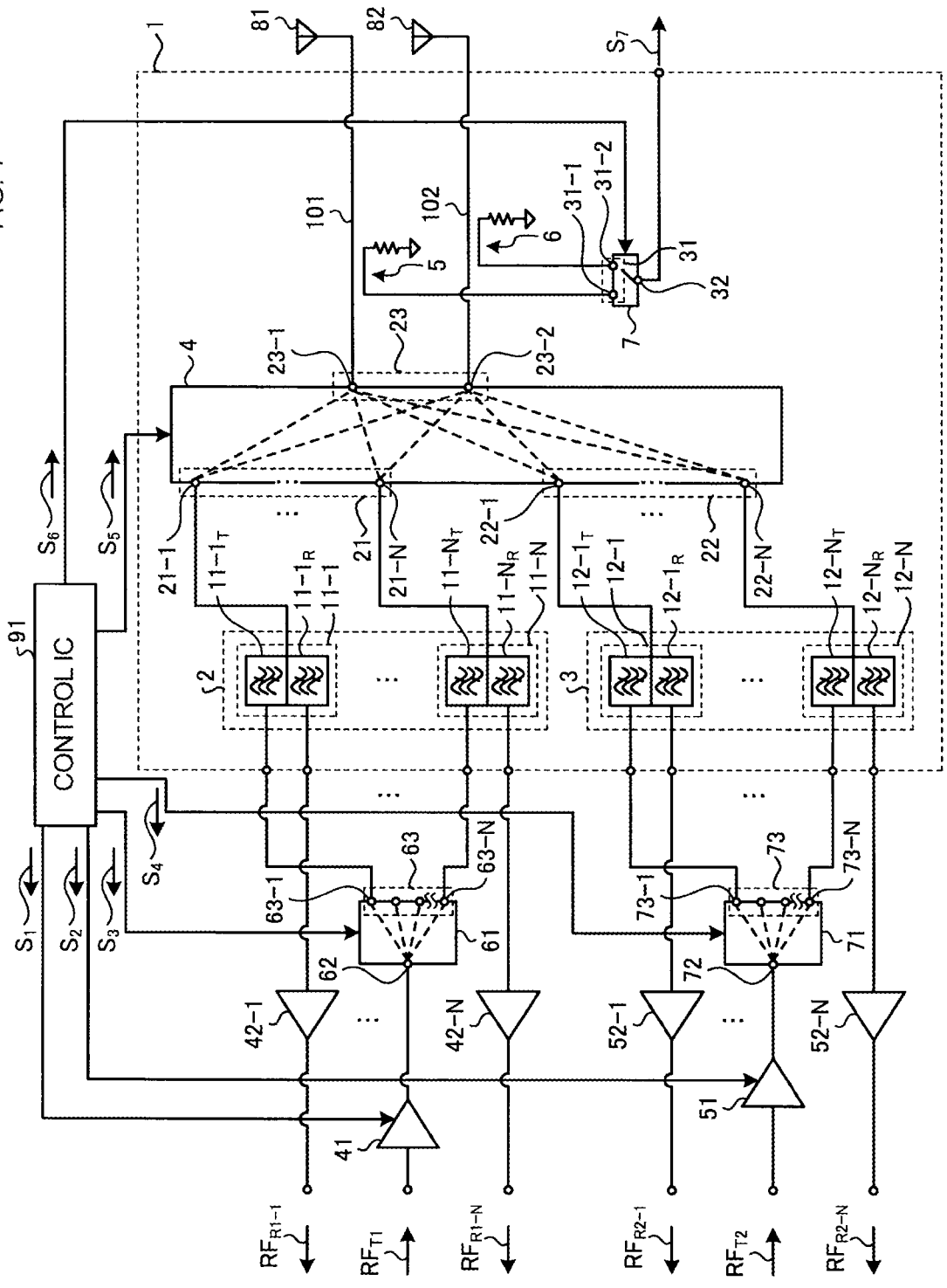
FIG. 1 illustrates a circuit configuration of a high-frequency signal transmission-reception circuit according to a first embodiment.

FIG. 1 illustrates a circuit configuration of a high-frequency signal transmission-reception circuit according to a first embodiment. A high-frequency signal transmission-reception circuit 1 is a front-end module that can output high-frequency transmission signals to antennas 81 and 82 and can receive high-frequency reception signals from the antennas 81 and 82 in a mobile communication device, such as a mobile phone device. The front-end module can be constituted by one or more components mounted on a substrate.

In the first embodiment, although the number of antennas is two, the present disclosure is not limited to this. The number of antennas may be not less than three.

In the first embodiment, although a frequency band that can be transmitted and received by the antenna 82 is the same as a frequency band that can be transmitted and received by the antenna 81, the present disclosure is not limited to this.

Although frequencies of a high-frequency transmission signal and a high-frequency reception signal range, for example, from about several hundred megahertz (MHz) to about several tens of gigahertz (GHz), the present disclosure is not limited to this.

The high-frequency signal transmission-reception circuit 1 includes band pass filter groups 2 and 3, switches 4 and 7, and couplers 5 and 6.

Although each of the band pass filter groups 2 and 3 is constituted, for example, by one or more inductors and one or more capacitors, the present disclosure is not limited to this. The band pass filter groups 2 and 3 may be formed in or on the substrate. The switches 4 and 7, and the couplers 5 and 6 may be mounted on the substrate in or on which the band pass filter groups 2 and 3 are formed.

In the first embodiment, although the number of band pass filter groups is two, the present disclosure is not limited to this. The number of band pass filter groups may be not less than three. Although an example is given where the number of band pass filter groups is equal to the number of antennas, the present disclosure is not limited to this.

The band pass filter groups 2 and 3 correspond to "a plurality of band pass filter groups" in the present disclosure.

In the first embodiment, although the number of couplers is two, the present disclosure is not limited to this. The number of couplers may be not less than three. Although an example is given where the number of couplers is equal to the number of antennas, the present disclosure is not limited to this.

The band pass filter group 2 includes N number of band pass filter pairs (where N is a natural number not less than two) of band pass filter pairs 11-1 to 11-N.

The band pass filter pairs 11-1 to 11-N in the band pass filter group 2 correspond to "a plurality of band pass filter pairs" in the present disclosure.

The band pass filter pair 11-1 includes a band pass filter 11-1$_T$ that band-passes a high-frequency transmission signal and a band pass filter 11-1$_R$ that band-passes a high-frequency reception signal. The band pass filter pair 11-N includes a band pass filter 11-N$_T$ that band-passes a high-frequency transmission signal and a band pass filter 11-N$_R$ that band-passes a high-frequency reception signal.

A band pass filter that band-passes a high-frequency transmission signal corresponds to "transmission band pass filter" in the present disclosure. A band pass filter that band-passes a high-frequency reception signal corresponds to "reception band pass filter" in the present disclosure.

Incidentally, each of the band pass filter pairs 11-1 to 11-N includes, but is not limited to, one transmission band pass filter and one reception band pass filter. For example, each of the band pass filter pairs 11-1 to 11-N may include only a transmission band pass filter or may include only a reception band pass filter. Furthermore, for example, each of the band pass filter pairs 11-1 to 11-N may include a plurality of transmission band pass filters or may include a plurality of reception band pass filters. There is no limit to a breakdown of band pass filters included in each of the band pass filter pairs 11-1 to 11-N (the number of transmission band pass filters and the number of reception band pass filters). The band pass filter group 2 only has to include, as a whole, at least one transmission band pass filter and at least one reception band pass filter. Each of the band pass filter pairs 11-1 to 11-N can be changed as appropriate in accordance with communication schemes (such as frequency division duplex (FDD) and time division duplex (TDD)), bands (such as long term evolution (LTE) bands 1, 2, . . . ), and so forth.

Although each of the band pass filter pairs 11-1 to 11-N is a duplexer, the present disclosure is not limited to this.

Although frequencies of high-frequency transmission signals and high-frequency reception signals that are band-passed by the band pass filter pairs 11-1 to 11-N differ from each other, the present disclosure is not limited to this.

The band pass filter group 3 includes band pass filter pairs 12-1 to 12-N.

The band pass filter pairs 12-1 to 12-N in the band pass filter group 3 correspond to "a plurality of band pass filter pairs" in the present disclosure.

In the first embodiment, although a configuration of the band pass filter group 3 is similar to the configuration of the band pass filter group 2, the present disclosure is not limited to this. For example, in the first embodiment, although the number of band pass filter pairs included in the band pass filter group 3 is equal to the number of band pass filter pairs included in the band pass filter group 2, the present disclosure is not limited to this. The number of band pass filter pairs included in the band pass filter group 3 may differ from the number of band pass filter pairs included in the band pass filter group 2.

The band pass filter pair 12-1 includes a band pass filter 12-1$_T$ that band-passes a high-frequency transmission signal and a band pass filter 12-1$_R$ that band-passes a high-frequency reception signal. The band pass filter pair 12-N includes a band pass filter 12-N$_T$ that band-passes a high-frequency transmission signal and a band pass filter 12-N$_R$ that band-passes a high-frequency reception signal.

Although each of the band pass filter pairs 12-1 to 12-N is a duplexer, the present disclosure is not limited to this.

Although frequencies of high-frequency transmission signals and high-frequency reception signals that are band-passed by the band pass filter pairs 12-1 to 12-N differ from each other, the present disclosure is not limited to this.

The switch 4 includes band pass filter-side terminal groups 21 and 22, and an antenna-side terminal group 23.

The band pass filter-side terminal groups 21 and 22 correspond to "a plurality of band pass filter-side terminal groups" in the present disclosure.

The band pass filter-side terminal group 21 includes band pass filter-side terminals 21-1 to 21-N.

The band pass filter-side terminals 21-1 to 21-N are electrically connected to respective one ends of the band pass filter pairs 11-1 to 11-N in the band pass filter group 2.

In the first embodiment, although the number of terminals included in the band pass filter-side terminal group 21 is equal to the number of band pass filter pairs included in the band pass filter group 2, the present disclosure is not limited to this.

The band pass filter-side terminal group 22 includes band pass filter-side terminals 22-1 to 22-N.

The band pass filter-side terminals 22-1 to 22-N are electrically connected to respective one ends of the band pass filter pairs 12-1 to 12-N in the band pass filter group 3.

In the first embodiment, although the number of terminals included in the band pass filter-side terminal group 22 is equal to the number of band pass filter pairs included in the band pass filter group 3, the present disclosure is not limited to this.

The antenna-side terminal group 23 includes antenna-side terminals 23-1 and 23-2.

The antenna-side terminal 23-1 is electrically connected to the antenna 81 through a transmission path 101. The antenna-side terminal 23-2 is electrically connected to the antenna 82 through a transmission path 102.

In the first embodiment, although the number of antenna-side terminals included in the antenna-side terminal group 23 is equal to the number of antennas, the present disclosure is not limited to this.

In accordance with a control signal $S_5$ input from a control integrated circuit (IC) 91, the switch 4 electrically connects one band pass filter-side terminal in the band pass filter-side terminal group 21 and one antenna-side terminal in the antenna-side terminal group 23 and also electrically connects one band pass filter-side terminal in the band pass filter-side terminal group 22 and the other antenna-side terminal in the antenna-side terminal group 23.

For example, in accordance with the control signal $S_5$, the switch 4 electrically connects the band pass filter-side terminal 21-1 and the antenna-side terminal 23-1 and also electrically connects the band pass filter-side terminal 22-1 and the antenna-side terminal 23-2. Thus, a high-frequency transmission signal $RF_{T1}$ input to the band pass filter-side terminal 21-1 is output to the antenna 81, and a high-frequency reception signal $RF_{R1-1}$ input from the antenna 81 is output to the band pass filter-side terminal 21-1. Furthermore, a high-frequency transmission signal $RF_{T2}$ input to the band pass filter-side terminal 22-1 is output to the antenna 82, and a high-frequency reception signal $RF_{R2-1}$ input from the antenna 82 is output to the band pass filter-side terminal 22-1.

Furthermore, for example, in accordance with the control signal $S_5$, the switch 4 electrically connects the band pass filter-side terminal 21-1 and the antenna-side terminal 23-2 and also electrically connects the band pass filter-side terminal 22-1 and the antenna-side terminal 23-1. Thus, the high-frequency transmission signal $RF_{T1}$ input to the band pass filter-side terminal 21-1 is output to the antenna 82, and the high-frequency reception signal $RF_{R1-1}$ input from the antenna 82 is output to the band pass filter-side terminal 21-1. Furthermore, the high-frequency transmission signal $RF_{T2}$ input to the band pass filter-side terminal 22-1 is output to the antenna 81, and the high-frequency reception signal $RF_{R2-1}$ input from the antenna 81 is output to the band pass filter-side terminal 22-1.

The switch 4 is referred to as "direct mapping switch" in some cases. Here, "direct mapping switch" refers to the fact that a plurality of input-output ports can simultaneously connect to one input-output port. In other words, one input-output port connects to a plurality of input-output ports.

The switch 4 corresponds to "first switch" in the present disclosure.

The coupler 5 is provided in the transmission path 101. The coupler 6 is provided in the transmission path 102.

Although an example is given where the transmission paths 101 and 102 are wire lines, the present disclosure is not limited to this.

The switch 7 includes an input terminal group 31 and an output terminal 32. The input terminal group 31 includes input terminals 31-1 and 31-2.

In the first embodiment, although the number of input terminals included in the input terminal group 31 is equal to the number of couplers, the present disclosure is not limited to this.

The coupler 5 detects a signal strength of the high-frequency transmission signal $RF_{T1}$ or $RF_{T2}$ or high-frequency reception signal $RF_{R1}$ or $RF_{R2}$ transmitted on the transmission path 101 and outputs the signal strength to the input terminal 31-1.

The coupler 6 detects a signal strength of the high-frequency transmission signal $RF_{T1}$ or $RF_{T2}$ or high-frequency reception signal $RF_{R1}$ or $RF_{R2}$ transmitted on the transmission path 102 and outputs the signal strength to the input terminal 31-2.

In accordance with a control signal $S_6$ input from the control IC 91, the switch 7 electrically connects one input terminal in the input terminal group 31 and the output terminal 32. For example, the switch 7 electrically connects the input terminal 31-1 and the output terminal 32 in accordance with the control signal $S_6$. Thus, a detection signal of the coupler 5 is output as a detection signal $S_7$ to the outside. Furthermore, for example, the switch 7 electrically connects the input terminal 31-2 and the output terminal 32 in accordance with the control signal $S_6$. Thus, a detection signal of the coupler 6 is output as the detection signal $S_7$ to the outside.

The switch 7 corresponds to "second switch" in the present disclosure.

Other ends of a plurality of transmission band pass filters (the band pass filter $11\text{-}1_T$ to the band pass filter $11\text{-}N_T$) in the band pass filter group 2 are electrically connected to a switch 61. The switch 61 includes an input terminal 62 and a terminal group 63.

The terminal group 63 includes terminals 63-1 to 63-N.

The terminals 63-1 to 63-N are electrically connected to the respective other ends of the plurality of transmission band pass filters (the band pass filter $11\text{-}1_T$ to the band pass filter $11\text{-}N_T$) in the band pass filter group 2.

The input terminal 62 is electrically connected to an output terminal of a multi-band power amplifier 41. The high-frequency transmission signal $RF_{T1}$ is input to an input terminal of the power amplifier 41. The power amplifier 41 amplifies the high-frequency transmission signal $RF_{T1}$ and then outputs the high-frequency transmission signal $RF_{T1}$ to the input terminal 62.

A frequency band of the high-frequency transmission signal $RF_{T1}$ can take on various frequency bands. The frequency band of the high-frequency transmission signal $RF_{T1}$ may be fixed or variable. The high-frequency transmission signal $RF_{T1}$ may be an FDD signal or TDD signal.

The switch 61 electrically connects the input terminal 62 and one terminal in the terminal group 63 in accordance with a control signal $S_3$ input from the control IC 91.

For example, in the case where the high-frequency transmission signal $RF_{T1}$ is in a certain frequency band, the switch 61 electrically connects the input terminal 62 and the terminal 63-1 in accordance with the control signal $S_3$. Thus, the output terminal of the power amplifier 41 and the other end of the band pass filter $11\text{-}1_T$ are electrically connected to each other, and the high-frequency transmission signal $RF_{T1}$ is input to the band pass filter $11\text{-}1_T$.

Furthermore, for example, in the case where the high-frequency transmission signal $RF_{T1}$ is in another frequency band, the switch 61 electrically connects the input terminal 62 and the terminal 63-N in accordance with the control signal $S_3$. Thus, the output terminal of the power amplifier 41 and the other end of the band pass filter $11\text{-}N_T$ are electrically connected to each other, and the high-frequency transmission signal $RF_{T1}$ is input to the band pass filter $11\text{-}N_T$.

The switch 61 is referred to as "direct mapping switch" in some cases.

The switch 61 corresponds to "third switch" in the present disclosure.

Other ends of a plurality of reception band pass filters (the band pass filter $11\text{-}1_R$ to the band pass filter $11\text{-}N_R$) in the band pass filter group 2 are electrically connected to respective low noise amplifiers 42-1 to 42-N. The low noise amplifier 42-1 amplifies the high-frequency reception signal $RF_{R1-1}$ having passed through the band pass filter $11\text{-}1_R$ and then outputs the high-frequency reception signal $RF_{R1-1}$. The low noise amplifier 42-N amplifies a high-frequency reception signal $RF_{R1-N}$ having passed through the band pass filter $11\text{-}N_R$ and then outputs the high-frequency reception signal $RF_{R1-N}$.

Other ends of a plurality of transmission band pass filters (the band pass filter $12\text{-}1_T$ to the band pass filter $12\text{-}N_T$) in the band pass filter group 3 are electrically connected to a switch 71. The switch 71 includes an input terminal 72 and a terminal group 73.

The terminal group 73 includes terminals 73-1 to 73-N.

The terminals 73-1 to 73-N are electrically connected to the respective other ends of the plurality of transmission band pass filters (the band pass filter 12-1$_T$ to the band pass filter 12-N$_T$) in the band pass filter group 3.

The input terminal 72 is electrically connected to an output terminal of a multi-band power amplifier 51. The high-frequency transmission signal RF$_{T2}$ is input to an input terminal of the power amplifier 51. The power amplifier 51 amplifies the high-frequency transmission signal RF$_{T2}$ and then outputs the high-frequency transmission signal RF$_{T2}$ to the input terminal 72.

A frequency band of the high-frequency transmission signal RF$_{T2}$ can take on various frequency bands. The frequency band of the high-frequency transmission signal RF$_{T2}$ may be fixed or variable. The high-frequency transmission signal RF$_{T2}$ may be an FDD signal or TDD signal. The frequency band of the high-frequency transmission signal RF$_{T2}$ may be the same as or different from the frequency band of the high-frequency transmission signal RF$_{T1}$.

The switch 71 electrically connects the input terminal 72 and one terminal in the terminal group 73 in accordance with a control signal S$_4$ input from the control IC 91.

For example, in the case where the high-frequency transmission signal RF$_{T2}$ is in a certain frequency band, the switch 71 electrically connects the input terminal 72 and the terminal 73-1 in accordance with the control signal S$_4$. Thus, the output terminal of the power amplifier 51 and the other end of the band pass filter 12-1$_T$ are electrically connected to each other, and the high-frequency transmission signal RF$_{T2}$ is input to the band pass filter 12-1$_T$.

Furthermore, for example, in the case where the high-frequency transmission signal RF$_{T2}$ is in another frequency band, the switch 71 electrically connects the input terminal 72 and the terminal 73-N in accordance with the control signal S$_4$. Thus, the output terminal of the power amplifier 51 and the other end of the band pass filter 12-N$_T$ are electrically connected to each other, and the high-frequency transmission signal RF$_{T2}$ is input to the band pass filter 12-N$_T$.

The switch 71 is referred to as "direct mapping switch" in some cases.

Other ends of a plurality of reception band pass filters (the band pass filter 12-1$_R$ to the band pass filter 12-N$_R$) in the band pass filter group 3 are electrically connected to respective low noise amplifiers 52-1 to 52-N. The low noise amplifier 52-1 amplifies the high-frequency reception signal RF$_{R2-1}$ having passed through the band pass filter 12-1$_R$ and then outputs the high-frequency reception signal RF$_{R2-1}$. The low noise amplifier 52-N amplifies a high-frequency reception signal RF$_{R2-N}$ having passed through the band pass filter 12-N$_R$ and then outputs the high-frequency reception signal RF$_{R2-N}$.

The control IC 91 controls gains of the power amplifiers 41 and 51.

For example, in the case where the high-frequency transmission signal RF$_{T1}$ is transmitted on the transmission path 101, the control IC 91 outputs, in accordance with the detection signal S$_7$ output from the coupler 5, a control signal S$_1$ that controls the gain of the power amplifier 41 to the power amplifier 41. Furthermore, for example, in the case where the high-frequency transmission signal RF$_{T1}$ is transmitted on the transmission path 102, the control IC 91 outputs, in accordance with the detection signal S$_7$ output from the coupler 6, the control signal S$_1$ that controls the gain of the power amplifier 41 to the power amplifier 41. Thus, the control IC 91 can control a signal strength of the high-frequency transmission signal RF$_{T1}$ on the transmission path 101 or 102 so that the signal strength reaches a desired value.

Furthermore, for example, in the case where the high-frequency transmission signal RF$_{T2}$ is transmitted on the transmission path 101, the control IC 91 outputs, in accordance with the detection signal S$_7$ output from the coupler 5, a control signal S$_2$ that controls the gain of the power amplifier 51 to the power amplifier 51. Furthermore, for example, in the case where the high-frequency transmission signal RF$_{T2}$ is transmitted on the transmission path 102, the control IC 91 outputs, in accordance with the detection signal S$_7$ output from the coupler 6, the control signal S$_2$ that controls the gain of the power amplifier 51 to the power amplifier 51. Thus, the control IC 91 can control a signal strength of the high-frequency transmission signal RF$_{T2}$ on the transmission path 101 or 102 so that the signal strength reaches a desired value.

The high-frequency signal transmission-reception circuit 1 enables the following by using the above-described configuration.

For example, the high-frequency transmission signal RF$_{T1}$ can be transmitted along a path from the power amplifier 41, to the input terminal 62, to the terminal 63-1, to the band pass filter 11-1$_T$, to the band pass filter-side terminal 21-1, to the antenna-side terminal 23-1, to the transmission path 101, and then to the antenna 81. Also, the high-frequency transmission signal RF$_{T2}$ can be transmitted along a path from the power amplifier 51, to the input terminal 72, to the terminal 73-1, to the band pass filter 12-1$_T$, to the band pass filter-side terminal 22-1, to the antenna-side terminal 23-2, to the transmission path 102, and then to the antenna 82.

Furthermore, for example, the high-frequency reception signal RF$_{R1-1}$ can be received along a path from the antenna 81, to the transmission path 101, to the antenna-side terminal 23-1, to the band pass filter-side terminal 21-1, to the band pass filter 11-1$_R$, and then to the low noise amplifier 42-1. Also, the high-frequency reception signal RF$_{R2-1}$ can be received along a path from the antenna 82, to the transmission path 102, to the antenna-side terminal 23-2, to the band pass filter-side terminal 22-1, to the band pass filter 12-1$_R$, and then to the low noise amplifier 52-1.

Thus, the high-frequency signal transmission-reception circuit 1 can be used in the case of a plurality of antennas. Furthermore, in the high-frequency signal transmission-reception circuit 1, carrier aggregation (CA) or multiple-input and multiple-output (MIMO) can be implemented.

Furthermore, the control IC 91 can output, in accordance with a detection signal of the coupler 5 and a detection signal of the coupler 6, the control signal S$_5$ to the switch 4 in such a manner that, of the antennas 81 and 82, an antenna whose gain is higher is used on a priority basis. For example, when the detection signal S$_7$ output from the coupler 5 is larger than the detection signal S$_7$ output from the coupler 6, the control IC 91 can output the control signal S$_5$ to the switch 4 in such a manner that the antenna-side terminal 23-1 and the band pass filter-side terminal group 21 or 22 are electrically connected to each other on a priority basis.

Thus, the high-frequency signal transmission-reception circuit 1 reduces loss of a high-frequency signal or the influence of noise in accordance with a communication state, and good communication can be achieved.

Furthermore, the coupler 5 is provided in the transmission path 101, and the coupler 6 is provided in the transmission path 102.

Thus, the high-frequency signal transmission-reception circuit 1 can detect load variations of the antennas 81 and 82 individually, and can facilitate adjustment of the gains of the power amplifiers 41 and 51 in accordance with a communication state.

Furthermore, a detection signal of the coupler 5 can be transmitted along a path from the coupler 5, to the input terminal 31-1, to the output terminal 32, and then to the control IC 91. Furthermore, a detection signal of the coupler 6 can be transmitted along a path from the coupler 6, to the input terminal 31-2, to the output terminal 32, and then to the control IC 91. Incidentally, the control IC 91 does not have to perform monitoring of detection signals of the coupler 5 and the coupler 6 all the time, and the control IC 91 only has to perform monitoring as appropriate. Hence, the control IC 91 does not have to perform monitoring of both the detection signal of the coupler 5 and the detection signal of the coupler 6 at the same time.

Thus, in the high-frequency signal transmission-reception circuit 1, the number of wire lines conducting from the couplers 5 and 6 to the outside can be reduced from two to one, and a module size can therefore be reduced.

Second Embodiment

Figure 2:
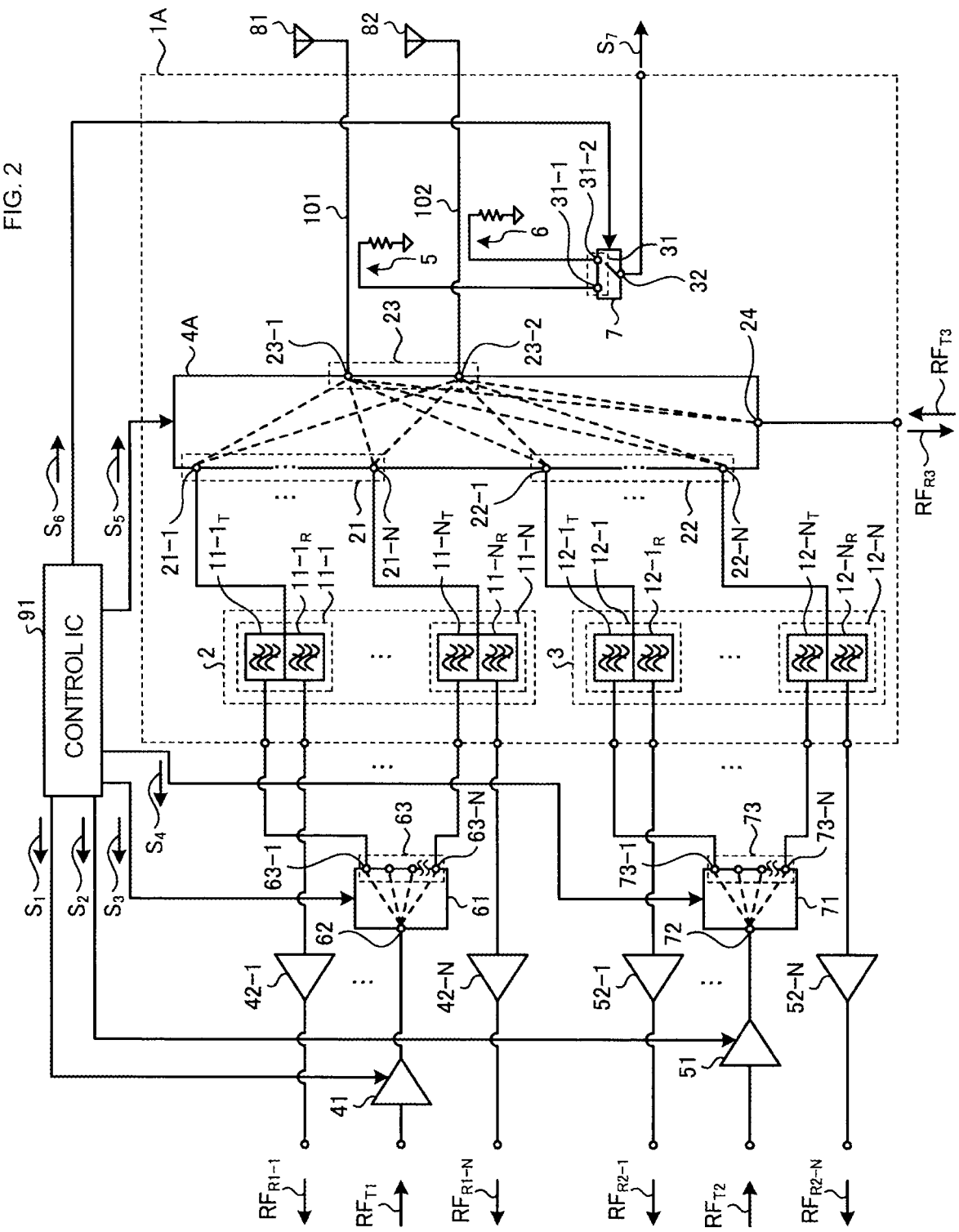
FIG. 2 illustrates a circuit configuration of a high-frequency signal transmission-reception circuit according to a second embodiment.

FIG. 2 illustrates a circuit configuration of a high-frequency signal transmission-reception circuit according to a second embodiment. Of components of a high-frequency signal transmission-reception circuit 1A, components that are the same as those in other embodiments are denoted by the same reference numerals, and descriptions thereof are omitted.

In comparison with the high-frequency signal transmission-reception circuit 1 (see FIG. 1), the high-frequency signal transmission-reception circuit 1A includes a switch 4A in place of the switch 4.

In comparison with the switch 4 (see FIG. 1), the switch 4A further includes an input or output terminal 24. The input or output terminal 24 can be electrically connected, for example, to a power amplifier or low noise amplifier external to the high-frequency signal transmission-reception circuit 1A.

The switch 4A electrically connects the input or output terminal 24 and one terminal in the antenna-side terminal group 23 in accordance with the control signal $S_5$ input from the control IC 91.

For example, the switch 4A electrically connects the input or output terminal 24 and the antenna-side terminal 23-1 in accordance with the control signal $S_5$. Thus, a high-frequency transmission signal $RF_{T3}$ input to the input or output terminal 24 is output to the antenna 81, and a high-frequency reception signal $RF_{R3}$ input from the antenna 81 is output to the input or output terminal 24.

Furthermore, for example, the switch 4A electrically connects the input or output terminal 24 and the antenna-side terminal 23-2 in accordance with the control signal $S_5$. Thus, the high-frequency transmission signal $RF_{T3}$ input to the input or output terminal 24 is output to the antenna 82, and the high-frequency reception signal $RF_{R3}$ input from the antenna 82 is output to the input or output terminal 24.

Thus, in an area where a local frequency band is necessary, a power amplifier and a low noise amplifier are externally installed, and the high-frequency signal transmission-reception circuit 1A can use the antennas 81 and 82.

Third Embodiment

Figure 3:
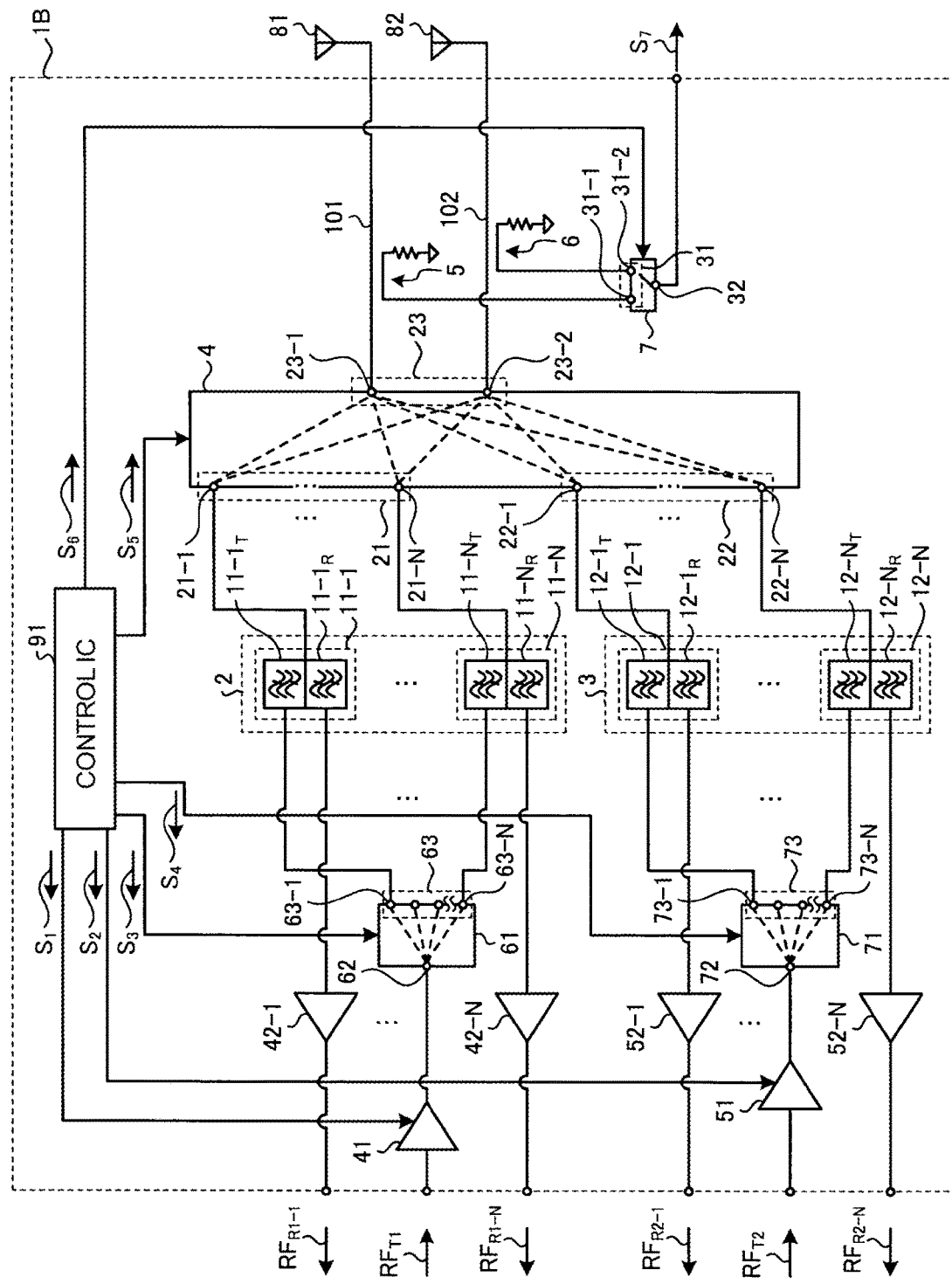
FIG. 3 illustrates a circuit configuration of a high-frequency signal transmission-reception circuit according to a third embodiment.

FIG. 3 illustrates a circuit configuration of a high-frequency signal transmission-reception circuit according to a third embodiment. Of components of a high-frequency signal transmission-reception circuit 1B, components that are the same as those in other embodiments are denoted by the same reference numerals, and descriptions thereof are omitted.

In comparison with the high-frequency signal transmission-reception circuit 1 (see FIG. 1), the high-frequency signal transmission-reception circuit 1B includes the power amplifiers 41 and 51, the low noise amplifiers 42-1 to 42-N and 52-1 to 52-N, the switches 61 and 71, and the control IC 91. In other words, the power amplifiers 41 and 51, the low noise amplifiers 42-1 to 42-N and 52-1 to 52-N, the switches 61 and 71, and the control IC 91 are mounted on the substrate in or on which the band pass filter groups 2 and 3 are formed.

Incidentally, the high-frequency signal transmission-reception circuit 1B includes, but is not limited to, all of the power amplifiers 41 and 51, the low noise amplifiers 42-1 to 42-N and 52-1 to 52-N, the switches 61 and 71, and the control IC 91. The high-frequency signal transmission-reception circuit 1B may include some of the power amplifiers 41 and 51, the low noise amplifiers 42-1 to 42-N and 52-1 to 52-N, the switches 61 and 71, and the control IC 91.

Thus, in the high-frequency signal transmission-reception circuit 1B, components can be mounted (integrated) on the substrate. The footprint of the mobile communication device can therefore be reduced, and the reliability thereof can also be increased.

Incidentally, the third embodiment may be combined with another embodiment. For example, the third embodiment may be combined with the second embodiment. In other words, the high-frequency signal transmission-reception circuit 1B may include the switch 4A (see FIG. 2) included in the high-frequency signal transmission-reception circuit 1A according to the second embodiment in place of the switch 4.

Fourth Embodiment

Figure 4:
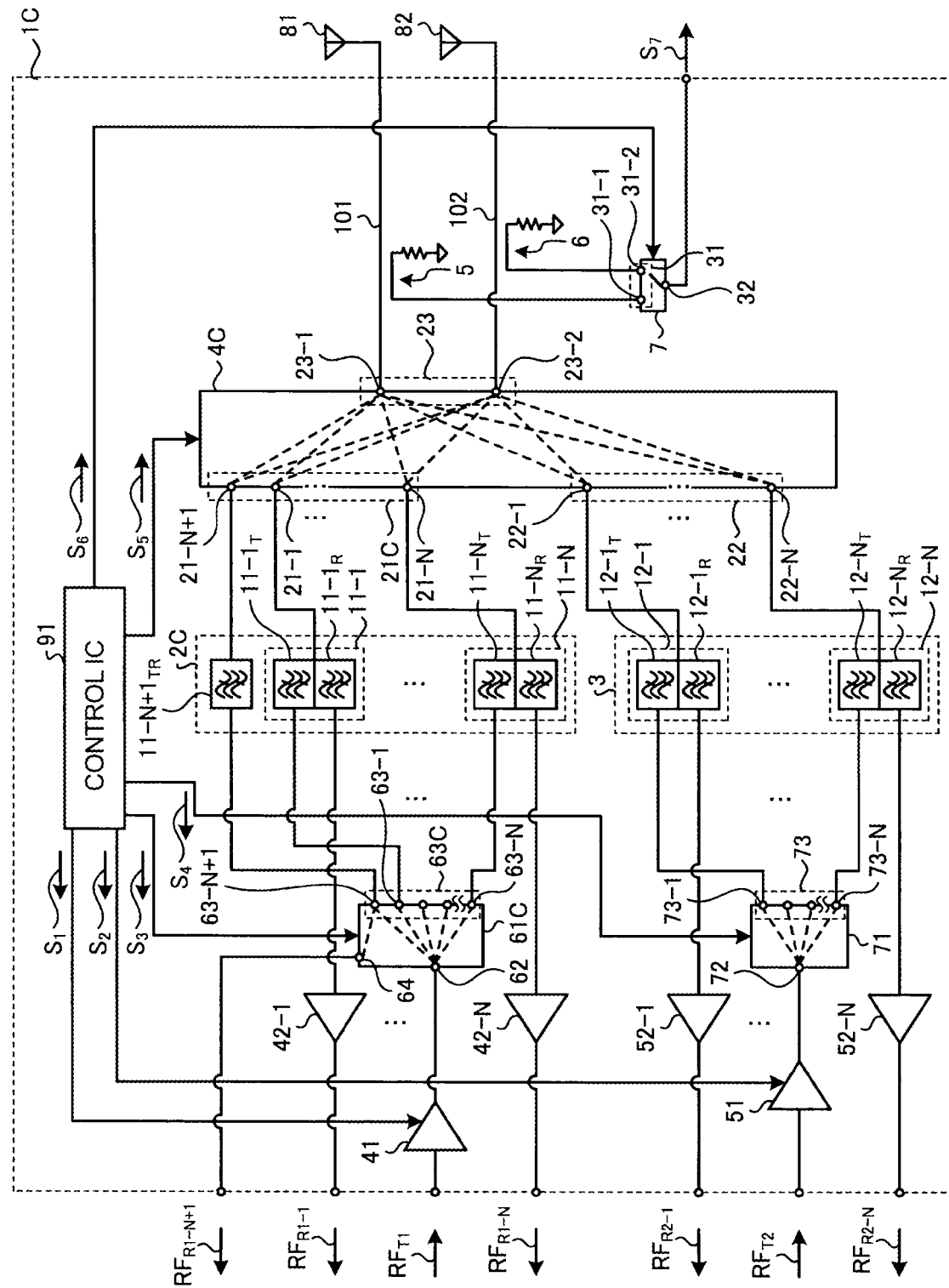
FIG. 4 illustrates a circuit configuration of a high-frequency signal transmission-reception circuit according to a fourth embodiment.

FIG. 4 illustrates a circuit configuration of a high-frequency signal transmission-reception circuit according to a fourth embodiment. Of components of a high-frequency signal transmission-reception circuit 1C, components that are the same as those in other embodiments are denoted by the same reference numerals, and descriptions thereof are omitted.

In comparison with the high-frequency signal transmission-reception circuit 1B (see FIG. 3), the high-frequency signal transmission-reception circuit 1C includes a band pass filter group 2C in place of the band pass filter group 2. Furthermore, the high-frequency signal transmission-reception circuit 1C includes a switch 4C in place of the switch 4. Furthermore, the high-frequency signal transmission-reception circuit 1C includes a switch 61C in place of the switch 61.

In comparison with the band pass filter group 2, the band pass filter group 2C further includes a band pass filter 11-N+1$_{TR}$.

For example, the band pass filter 11-N+1$_{TR}$ may be a band pass filter that band-passes a high-frequency signal in a frequency band ranging from about 1920 MHz to about 1990 MHz. Thus, the band pass filter 11-N+1$_{TR}$ can pass LTE band 1 high-frequency transmission signals (about 1920 MHz to about 1980 MHz) and also can pass LTE band 2 high-frequency reception signals (about 1930 MHz to about 1990 MHz). In other words, the band pass filter 11-N+1$_{TR}$ can be shared by transmission of a band 1 high-frequency transmission signal and reception of a band 2 high-frequency reception signal. Note that the frequency band band-passed by the band pass filter 11-N+1$_{TR}$ is not limited to this.

The band pass filter 11-N+1$_{TR}$ that band-passes a high-frequency transmission signal and band-passes a high-frequency reception signal corresponds to "transmission-reception band pass filter" in the present disclosure.

In comparison with the switch 4 (see FIG. 1), the switch 4C includes a band pass filter-side terminal group 21C in place of the band pass filter-side terminal group 21. In comparison with the band pass filter-side terminal group 21, the band pass filter-side terminal group 21C further includes a band pass filter-side terminal 21-N+1.

The band pass filter-side terminal 21-N+1 is electrically connected to one end of the band pass filter 11-N+1$_{TR}$.

The switch 4C electrically connects the band pass filter-side terminal 21-N+1 and one terminal in the antenna-side terminal group 23 in accordance with the control signal $S_5$ input from the control IC 91.

For example, the switch 4C electrically connects the band pass filter-side terminal 21-N+1 and the antenna-side terminal 23-1 in accordance with the control signal $S_5$. Thus, the high-frequency transmission signal $RF_{T1}$ (for example, a band 1 high-frequency transmission signal) input to the band pass filter-side terminal 21-N+1 is output to the antenna 81, and a high-frequency reception signal $RF_{R1}$-N+1 (for example, a band 2 high-frequency reception signal) input from the antenna 81 is output to the band pass filter-side terminal 21-N+1.

Furthermore, for example, the switch 4C electrically connects the band pass filter-side terminal 21-N+1 and the antenna-side terminal 23-2 in accordance with the control signal $S_5$. Thus, the high-frequency transmission signal $RF_{T1}$ (for example, a band 1 high-frequency transmission signal) input to the band pass filter-side terminal 21-N+1 is output to the antenna 82, and the high-frequency reception signal $RF_{R1}$-N+1 (for example, a band 2 high-frequency reception signal) input from the antenna 82 is output to the band pass filter-side terminal 21-N+1.

In comparison with the switch 61 (see FIG. 1), the switch 61C includes a terminal group 63C in place of the terminal group 63. In comparison with the terminal group 63, the terminal group 63C further includes a terminal 63-N+1. The terminal 63-N+1 is electrically connected to the other end of the band pass filter 11-N+1$_{TR}$.

Furthermore, the switch 61C further includes an output terminal 64. The output terminal 64 can be electrically connected, for example, to a low noise amplifier external to the high-frequency signal transmission-reception circuit 1C.

For example, the switch 61C electrically connects the input terminal 62 and the terminal 63-N+1 in accordance with the control signal $S_3$ input from the control IC 91. Thus, the high-frequency transmission signal $RF_{T1}$ (for example, a band 1 high-frequency transmission signal) input to the input terminal 62 is output to the terminal 63-N+1.

Furthermore, for example, the switch 61C electrically connects the output terminal 64 and the terminal 63-N+1 in accordance with the control signal $S_3$ input from the control IC 91. Thus, the high-frequency reception signal $RF_{R1}$-N+1 (for example, a band 2 high-frequency reception signal) input to the terminal 63-N+1 is output to the outside.

Thus, the band pass filter 11-N+1$_{TR}$ can be shared by transmission of a band 1 high-frequency transmission signal and reception of a band 2 high-frequency reception signal.

Hence, the high-frequency signal transmission-reception circuit 1C enables a reduction in the number of band pass filters and a reduction in size.

Incidentally, in the fourth embodiment, although the switch 61C includes the output terminal 64, the switch 71 may also include a terminal similar to the output terminal 64. Similarly, although the band pass filter group 2C includes the band pass filter 11-N+1$_{TR}$, the band pass filter group 3 may also include a band pass filter similar to the band pass filter 11-N+1$_{TR}$. Similarly, although the band pass filter-side terminal group 21C includes the band pass filter-side terminal 21-N+1, the band pass filter-side terminal group 22 may also include a terminal similar to the band pass filter-side terminal 21-N+1.

Furthermore, the fourth embodiment may be combined with another embodiment. For example, the fourth embodiment may be combined with the second embodiment. In other words, the switch 4C in the high-frequency signal transmission-reception circuit 1C may include the input or output terminal 24 (see FIG. 2) of the switch 4A included in the high-frequency signal transmission-reception circuit 1A according to the second embodiment.

Fifth Embodiment

Figure 5:
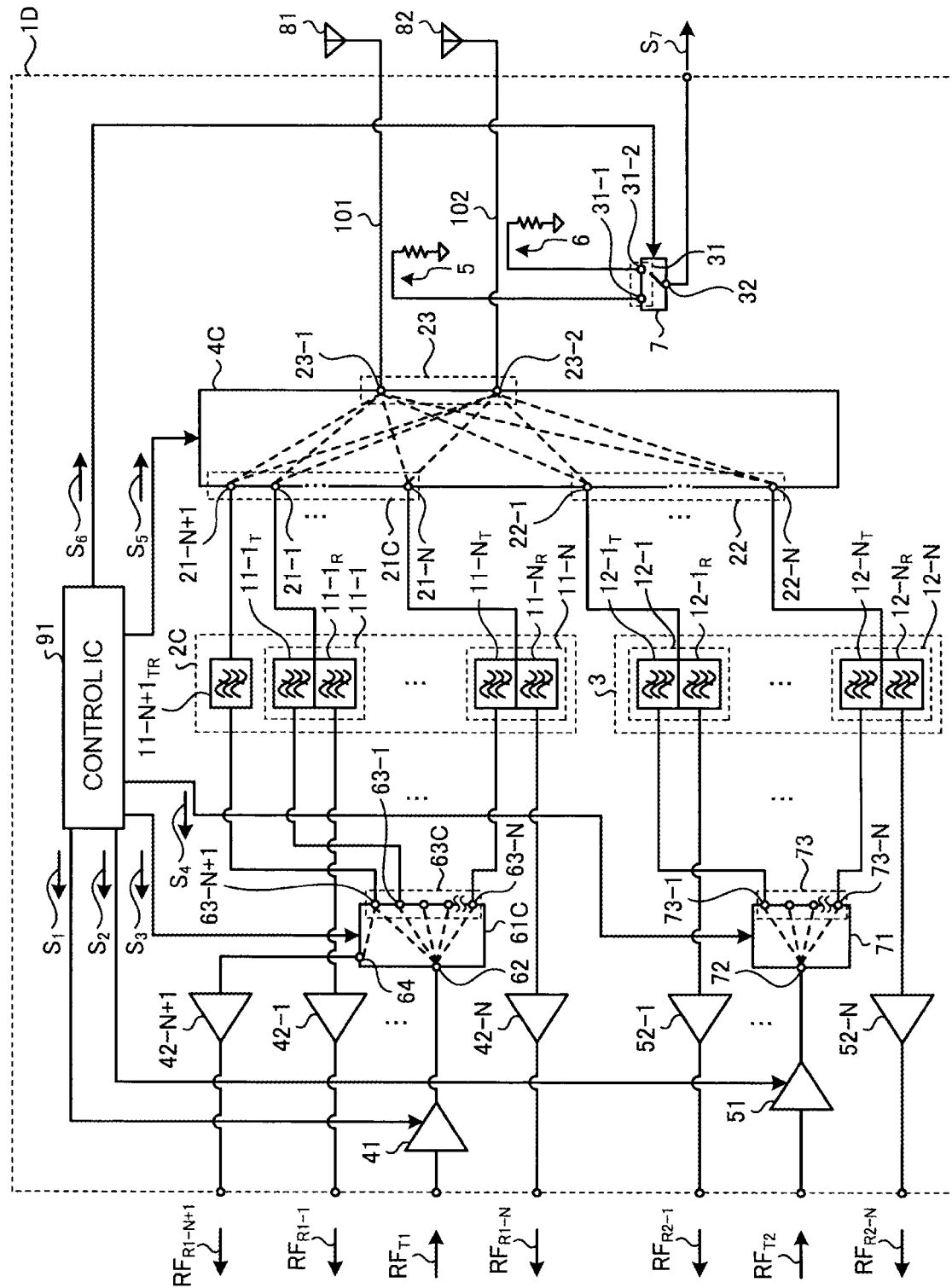
FIG. 5 illustrates a circuit configuration of a high-frequency signal transmission-reception circuit according to a fifth embodiment.

FIG. 5 illustrates a circuit configuration of a high-frequency signal transmission-reception circuit according to a fifth embodiment. Of components of a high-frequency signal transmission-reception circuit 1D, components that are the same as those in other embodiments are denoted by the same reference numerals, and descriptions thereof are omitted.

In comparison with the high-frequency signal transmission-reception circuit 1C, (see FIG. 4), the high-frequency signal transmission-reception circuit 1D includes a low noise amplifier 42-N+1.

The low noise amplifier 42-N+1 is electrically connected to the output terminal 64. The low noise amplifier 42-N+1 amplifies the high-frequency reception signal $RF_{R1\text{-}N+1}$ (for example, a band 2 high-frequency reception signal) having passed through the band pass filter 11-N+1$_{TR}$ and then outputs the high-frequency reception signal $RF_{R1\text{-}N+1}$.

As in the high-frequency signal transmission-reception circuit 1B, in the high-frequency signal transmission-reception circuit 1D, the footprint of the mobile communication device can be reduced, and the reliability thereof can also be increased.

Incidentally, the fifth embodiment may be combined with another embodiment. For example, the fifth embodiment may be combined with the second embodiment. In other words, the switch 4C in the high-frequency signal transmission-reception circuit 1D may include the input or output terminal 24 (see FIG. 2) of the switch 4A included in the high-frequency signal transmission-reception circuit 1A according to the second embodiment.

Sixth Embodiment

Figure 6:
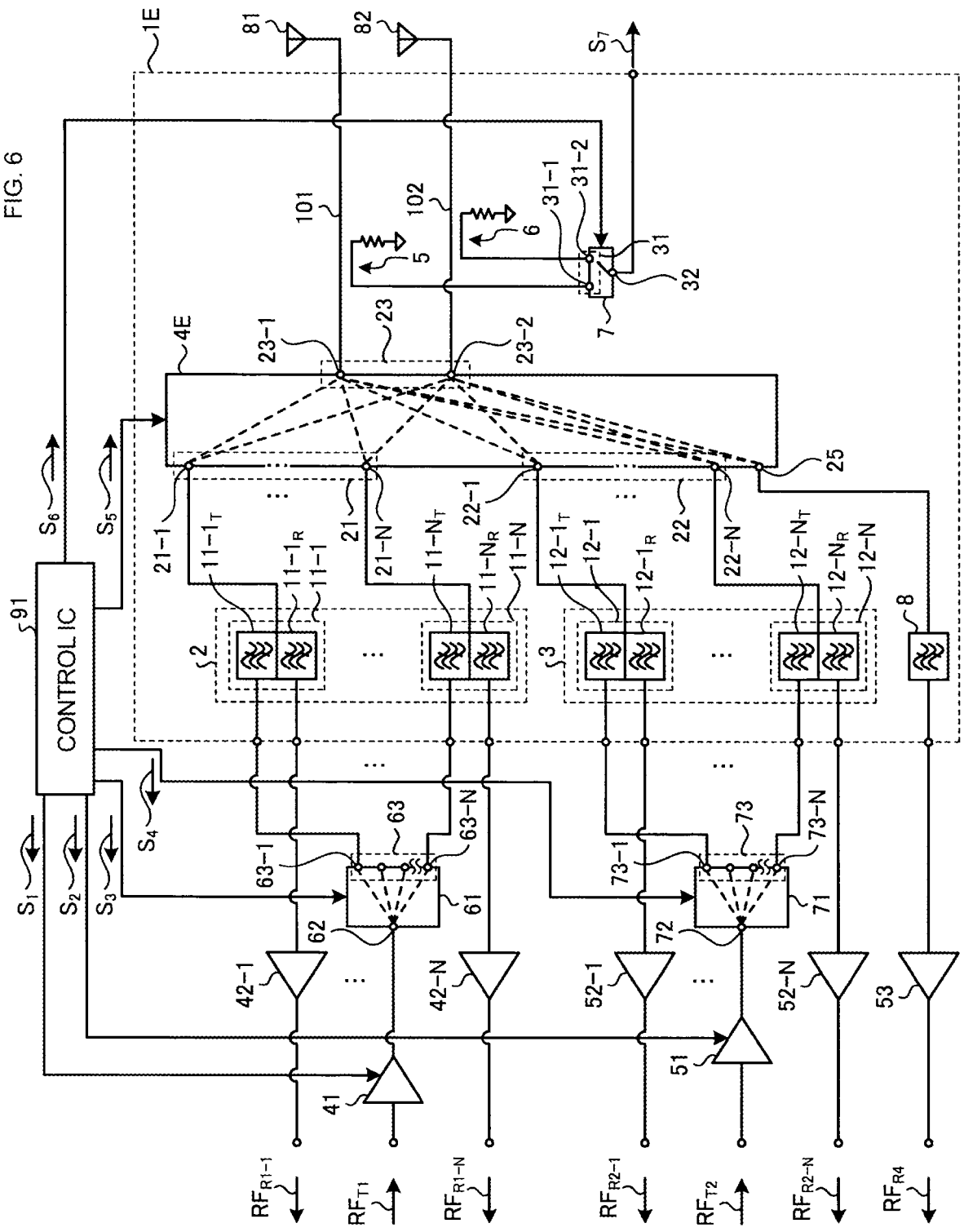
FIG. 6 illustrates a circuit configuration of a high-frequency signal transmission-reception circuit according to a sixth embodiment.

FIG. 6 illustrates a circuit configuration of a high-frequency signal transmission-reception circuit according to a sixth embodiment. Of components of a high-frequency signal transmission-reception circuit 1E, components that are the same as those in other embodiments are denoted by the same reference numerals, and descriptions thereof are omitted.

In comparison with the high-frequency signal transmission-reception circuit 1 (see FIG. 1), the high-frequency signal transmission-reception circuit 1E includes a switch 4E in place of the switch 4. Furthermore, the high-frequency signal transmission-reception circuit 1E further includes a band pass filter 8 that band-passes a high-frequency reception signal $RF_{R4}$.

The band pass filter 8 corresponds to "reception band pass filter" in the present disclosure.

Incidentally, although an example is given where the high-frequency reception signal $RF_{R4}$ is a high-frequency reception signal in a band (for example, LTE band 32) in which no transmission is performed and only reception is performed, the present disclosure is not limited to this. The high-frequency reception signal $RF_{R4}$ may be a high-frequency reception signal in a band in which both of transmission and reception are performed.

In comparison with the switch 4 (see FIG. 1), the switch 4E further includes an output terminal 25. The output terminal 25 is electrically connected to one end of the band pass filter 8. The other end of the band pass filter 8 is electrically connected to a low noise amplifier 53. The low noise amplifier 53 amplifies the high-frequency reception signal $RF_{R4}$ having passed through the band pass filter 8 and then outputs the high-frequency reception signal $RF_{R4}$.

The switch 4E electrically connects the output terminal 25 and one terminal in the antenna-side terminal group 23 in accordance with the control signal $S_5$ input from the control IC 91.

For example, the switch 4E electrically connects the output terminal 25 and the antenna-side terminal 23-1 in accordance with the control signal $S_5$. Thus, the high-frequency reception signal $RF_{R4}$ input from the antenna 81 is output to the output terminal 25.

Furthermore, for example, the switch 4E electrically connects the output terminal 25 and the antenna-side terminal 23-2 in accordance with the control signal $S_5$. Thus, the high-frequency reception signal $RF_{R4}$ input from the antenna 82 is output to the output terminal 25.

The high-frequency signal transmission-reception circuit 1E can simplify a reception path of the high-frequency reception signal $RF_{R4}$.

Incidentally, the sixth embodiment may be combined with another embodiment. For example, the sixth embodiment may be combined with the second embodiment. In other words, the switch 4E in the high-frequency signal transmission-reception circuit 1E may include the input or output terminal 24 (see FIG. 2) of the switch 4A included in the high-frequency signal transmission-reception circuit 1A according to the second embodiment.

Furthermore, for example, the sixth embodiment may be combined with the third embodiment. In other words, the high-frequency signal transmission-reception circuit 1E may include some or all of the power amplifiers 41 and 51, the low noise amplifiers 42-1 to 42-N, 52-1 to 52-N, and 53, the switches 61 and 71, and the control IC 91.

Furthermore, for example, the sixth embodiment may be combined with the fourth embodiment. In other words, the high-frequency signal transmission-reception circuit 1E may include the switch 61C (see FIG. 4) included in the high-frequency signal transmission-reception circuit 1C according to the fourth embodiment in place of the switch 61. Similarly, the high-frequency signal transmission-reception circuit 1E may include the band pass filter group 2C (see FIG. 4) included in the high-frequency signal transmission-reception circuit 1C according to the fourth embodiment in place of the band pass filter group 2. Similarly, the switch 4E included in the high-frequency signal transmission-reception circuit 1E may include the band pass filter-side terminal group 21C (see FIG. 4) of the switch 4C included in the high-frequency signal transmission-reception circuit 1C according to the fourth embodiment in place of the band pass filter-side terminal group 21. Furthermore, the high-frequency signal transmission-reception circuit 1E may further include the low noise amplifier 42-N+1 according to the fifth embodiment.

The above-described embodiments are intended to facilitate understanding of the present disclosure but is not intended for a limited interpretation of the present disclosure. The present disclosure can be changed or improved without necessarily departing from the gist thereof and also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A high-frequency signal transmission-reception circuit comprising:
a plurality of band pass filter groups, each band pass filter group comprising a plurality of band pass filter pairs, each band pass filter pair comprising at least one band pass filter;
a first switch comprising:
a plurality of band pass filter-side terminal groups, each band pass filter-side terminal group comprising a plurality of band pass filter-side terminals electrically connected to respective one of the plurality of band pass filter groups,
an antenna-side terminal group electrically connected to a plurality of antennas including a first antenna and a second antenna via a plurality of transmission paths, wherein the antenna-side terminal group is connectable to one of the plurality of band pass filter-side terminal groups, and an input or output terminal
electrically connected to a component external to the to the high-frequency signal transmission-reception circuit; a plurality of couplers,
each coupler being in a respective one of the plurality of transmission paths and configured to output respective detection signals, the detection signals representing a signal strength of a high-frequency signal transmitted on the respective transmission path; and
a second switch comprising an input terminal group electrically connected to the plurality of couplers, and an output terminal configured to output a detection signal from one of the plurality of couplers.

2. The high-frequency signal transmission reception circuit according to claim 1, further comprising:
a power amplifier electrically connected to a plurality of transmission band pass filters of a common band pass filter group among the plurality of band pass filter groups, and configured to output the high-frequency transmission signal to the plurality of transmission band pass filters.

3. The high-frequency signal transmission reception circuit according to claim 2, further comprising:
a plurality of low noise amplifiers electrically connected to respective ones of a plurality of reception band pass filters in the common band pass filter group, the reception band pass filters being configured to band-pass a high-frequency reception signal, and the plurality of low noise amplifiers being configured to amplify high-frequency reception signals having passed through respective reception band pass filters.

4. The high-frequency signal transmission reception circuit according to claim 2, further comprising:
a third switch comprising an input terminal to which the high-frequency transmission signal is input, and a terminal group electrically connected to the plurality of transmission band pass filters of the common band pass filter group, the transmission band pass filters being configured to band-pass the high-frequency transmission signal and the third switch being configured to electrically connect the input terminal to a first terminal in the terminal group.

5. The high-frequency signal transmission reception circuit according to claim 4, further comprising:
a plurality of low noise amplifiers electrically connected to respective ones of a plurality of reception band pass filters in the common band pass filter group, the reception band pass filters being configured to band-pass a high-frequency reception signal, and the plurality of low noise amplifiers being configured to amplify high-frequency reception signals having passed through respective reception band pass filters,
wherein the plurality of low noise amplifiers is configured to amplify high-frequency reception signals having passed through respective reception band pass filters without passing through the third switch.

6. The high-frequency signal transmission reception circuit according to claim 1, further comprising:
a control integrated circuit providing a control signal respectively to the first switch and the second switch, and
the control signal provided to the first switch and the control signal provided to the second switch are different from each other.

7. A high-frequency signal transmission-reception circuit comprising:
a plurality of band pass filter groups, each band pass filter group comprising a plurality of band pass filter pairs, each band pass filter pair comprising at least one band pass filter;
a first switch comprising:
a plurality of band pass filter-side terminal groups, each band pass filter-side terminal group comprising a plurality of band pass filter-side terminals electrically connectable to respective one of the plurality of band pass filter groups, and an antenna-side terminal group
electrically connected to a plurality of antennas including a first antenna and a second antenna via a plurality of transmission paths, wherein the antenna-side terminal group is connectable to one of the plurality of band pass filter-side terminal groups; a plurality of couplers,
each coupler being in a respective one of the plurality of transmission paths and configured to output respective detection signals, the detection signals representing a signal strength of a high-frequency signal transmitted on the respective transmission path;
a second switch comprising an input terminal group electrically connected to the plurality of couplers, and an output terminal configured to output a detection signal from one of the plurality of couplers; and
a control integrated circuit outputting a control signal respectively to the first switch and the second switch.

8. The high-frequency signal transmission reception circuit according to claim 7, wherein the control integrated circuit is configured to output the control signal to the first switch in such a manner that among the plurality of the antennas, an antenna whose gain is higher is used on a priority basis.

9. The high-frequency signal transmission reception circuit according to claim 7, further comprising:
a power amplifier electrically connected to a plurality of transmission band pass filters of a common band pass filter group among the plurality of band pass filter groups, and configured to output the high-frequency transmission signal to the plurality of transmission band pass filters.

10. The high-frequency signal transmission reception circuit according to claim 9, further comprising:
a plurality of low noise amplifiers electrically connected to respective ones of a plurality of reception band pass filters in the common band pass filter group, the reception band pass filters being configured to band-pass a high-frequency reception signal, and the plurality of low noise amplifiers being configured to amplify high-frequency reception signals having passed through respective reception band pass filters.

11. The high-frequency signal transmission reception circuit according to claim 9, further comprising:
a third switch comprising an input terminal to which the high-frequency transmission signal is input, and a terminal group electrically connected to the plurality of transmission band pass filters of the common band pass filter group, the transmission band pass filters being configured to band-pass the high-frequency transmission signal and the third switch being configured to electrically connect the input terminal to a first terminal in the terminal group.

* * * * *